United States Patent [19]

LaMarche

[11] 4,127,740

[45] Nov. 28, 1978

[54] ROUTING ARRANGEMENT FOR GROUND CONDUCTORS IN PRINTED CIRCUIT STRUCTURES

[75] Inventor: Frederick W. LaMarche, Northfield, Minn.

[73] Assignee: Sheldahl, Inc., Northfield, Minn.

[21] Appl. No.: 825,204

[22] Filed: Aug. 17, 1977

[51] Int. Cl.² .............................................. H05K 1/00
[52] U.S. Cl. .................................... 174/68.5; 29/625; 200/5 A; 200/159 B
[58] Field of Search ............... 174/68.5; 361/398, 409; 200/5 A, 159 B; 29/625

[56] References Cited

U.S. PATENT DOCUMENTS

| | | | |
|---|---|---|---|
| 2,666,254 | 1/1954 | Eisler | 29/625 |
| 3,531,603 | 9/1970 | Ashman | 200/11 J |
| 3,648,116 | 3/1972 | Baugher et al. | 361/409 |
| 3,676,607 | 7/1972 | Nash et al. | 361/398 |
| 3,728,509 | 4/1973 | Shimojo | 200/159 B |

Primary Examiner—J. V. Truhe
Assistant Examiner—J. H. Bouchard
Attorney, Agent, or Firm—Orrin M. Haugen; Thomas J. Nikolai

[57] ABSTRACT

A universal printed circuit pattern of conductors for use in connection with diaphragm-type push button electrical switch panels which allows the printed circuit board to be physically sheared along plural axes to accommodate switch panels of varying sizes without destroying electrical continuity of the ground or common conductor thereon.

5 Claims, 2 Drawing Figures

ROUTING ARRANGEMENT FOR GROUND CONDUCTORS IN PRINTED CIRCUIT STRUCTURES

BACKGROUND OF THE INVENTION

I. Field of the Invention

This invention relates generally to printed circuit board technology and more specifically to the arrangement of printed circuit conductors on an insulating substrate for use in conjunction with diaphragm type push button switch panels, the pattern of conductors being such that the panel may be sheared along plural axes without breaking the common ground conductor associated with the switches. Thus, it is possible to mass produce a single printed circuit board which may be cut to a desired size to accommodate a lesser number of switch positions than can be used on the entire board.

II. Description of Prior Art

There is described in the prior art various arrangements of diaphragm type electrical push button switches for use in connection with keyboards. For example, the Sudduth U.S. Pat. No. 3,699,294 discloses such a keyboard in which a printed circuit panel is provided having a plurality of interleaved fingers at each desired switch position location. Associated with this pattern is an overlay substrate having apertures therein corresponding to the desired switch position. Located above the apertured substrate is a flexible membrane having conductive material disposed on the underside thereof and finally a keyboard cover having indicia thereon. When the assembly is sandwiched together and a given key area on the cover is depressed, the flexible membrane is forced through the apertured substrate to short out the fingers on the printed circuit pattern to thereby signal the particular key area which had been depressed.

Similarly, the Nash et al U.S. Pat. No. 3,676,607 discloses a membrane type switch panel having a circular conductive area at each desired switch position, the circular conductive areas being segmented into three parts. A given segment of each switch position in a given row is tied in common with a row conductor and a different segment of each conductive area in a given column is connected in common by a column conductor. The third segment of each circular conductive area on the keyboard is tied in common by means of a ground conductor pattern.

It is to be noted from the above described prior art patents that the printed circuit conductor patterns must be specially designed for a given size of keyboard. For example, if one desires a keyboard having, say, sixteen diaphragm type switch buttons for a particular application, the printed circuit conductor pattern associated therewith must be specially designed to have sixteen switch locations. If a particular application calls for a lesser number of switches, for example, twelve, it will be necessary for one following the teachings of the prior art to specially lay out and manufacture a printed circuit board having only twelve switch locations. This would, of course, require different art work for each desired configuration with the attendant inventory problem of maintaining a large variety of printed circuit boards.

In accordance with the teachings of the present invention, however, there is provided the design of a printed circuit pattern which is more universal in character. More specifically, there is provided a printed circuit pattern for use in connection with diaphragm-type push button electrical switches which may be configured to accommodate a maximum size keyboard panel. Because of the unique manner in which the conductors leading to the interlaced fingers are configured on the board, it becomes possible to fabricate a keyboard of a smaller size by merely shearing off one or more rows or columns from the master board and this may be accomplished without destroying the continuity of the common or ground conductor employed therein.

The objects and advantages of this invention will become apparent from the description and claims which follow, taken together with the accompanying drawings.

DESCRIPTION OF THE PREFERRED EMBODIMENTS

Figure 1:
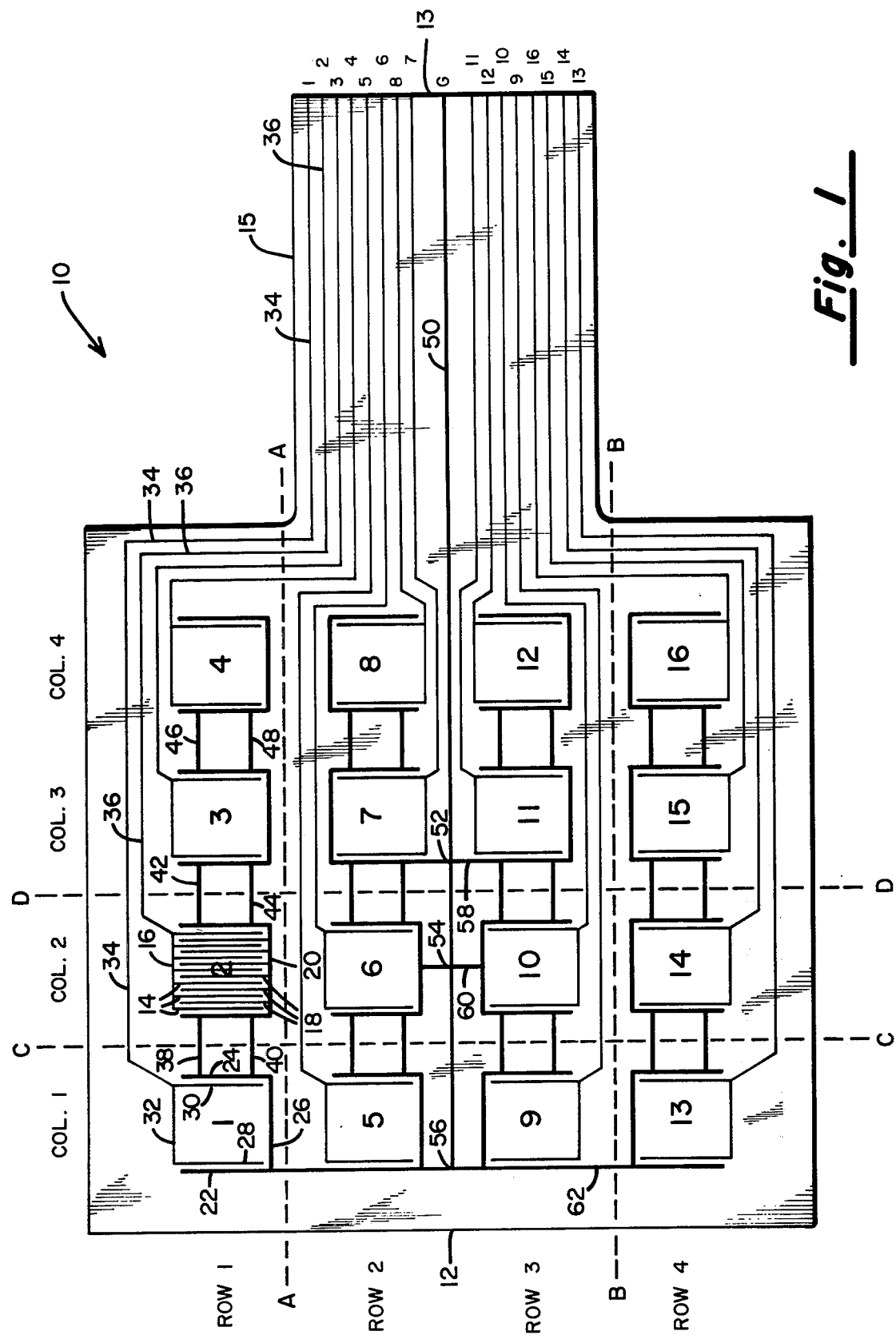
FIG. 1 is a plan view of a first embodiment of the invention.

Referring to FIG. 1, there is indicated generally by numeral 10 a universal printed circuit board for use with a diaphragm-type switch panel. An insulating substrate 12, which may be formed from any one of a number of commonly used printed circuit materials, is provided and formed on the insulating substrate 12 are a plurality of switch locations, here identified by the large numerals 1 through 16. These switch locations are arranged in a matrix type array of rows and columns. Thus, switch positions 1 through 4 are located in row 1 while switch positions 1, 5, 9 and 13 are located in column 1. It should be, of course, obvious that a greater number of switch positions may be provided on the substrate 12 by adding further rows and columns.

Each switch position includes a plurality of interleaved conductive fingers. For example, the switch position number 2 at the intersection of row 1 and column 2 includes a plurality of fingers 14 extending downward from a horizontal bridging conductor 16 and a plurality of conductive fingers 18 extending upward from a horizontal bridging conductor 20. As can be seen from FIG. 1, the fingers 14 and 18 are interleaved and are in a parallel and close, but noncontacting relationship with each other. When the universal printed circuit board of the present invention is used in a diaphragm-type switch application, a spacer member (not shown) is superimposed upon the substrate 12 and at each switch location there is provided in the spacer member an aperture. Overlaying the spacer member, then, is a flexible insulator having a conductive pattern disposed in orientation with the apertures in the spacer member such that when the flexible printed circuit overlay is depressed by an operator in an area designated as a switch location, the conductive pattern on the flexible membrane passes through the aperture and acts to electrically short the fingers 18 to the fingers 14.

While each of the switch positions 1 through 16 include a large plurality of interleaved fingers such as is shown in detail at switch position 2 in FIG. 1, for ease of viewing, the remaining switch positions (other than switch position 2) are depicted by showing only the interleaved conductive fingers at the borders of the switch position. More specifically, considering switch position 1, there is shown first and second upwardly extending fingers 22 and 24 which are bridged together by a horizontal conductor 26. Similarly, downwardly extending conductive fingers 28 and 30 are illustrated and are connected together by a horizontal conductive link 32.

By observing FIG. 1, it can be seen that one set of conducting fingers is electrically connected to form a common ground pattern. For ease of viewing, the ground conductor pattern is represented in FIG. 1 by heavy lines although, in practice, the width of the ground conductor lines need not be of a different dimension from the remaining conductors associated with the other set of conductive fingers of the several switch positions. Thus, in the following description, the set of fingers which are electrically connected to the lines shown in heavier shading will be referred to as the "grounded fingers" while the conductive fingers associated with the lighter shaded lines will be referred to as the "ungrounded fingers".

With the foregoing definition in mind, then, it can be seen that the ungrounded fingers at each switch position are connected in common and to a printed conductor which is routed across the surface of the substrate 12 to the edge 13 of a terminal area 15. Specifically, and by way of example, the ungrounded fingers 28 and 30 of switch position 1 are connected together by the bridging conductor 32 which, in turn, is connected by a printed conductor 34 to a point identified by the small number 1 at the edge 13 of the printed circuit board terminal area 15. The edge 13 is adapted to mate with a suitable printed circuit board edge connector such that electrical currents may be applied to the panel 10 from an external source (not shown). Similarly, the horizontal bridging conductor 16 at switch position 2 is connected by means of a printed wire 36 to terminal number 2 at the edge 13 of the printed circuit board terminal area 15.

With reference to the drawing of FIG. 1, a person reading this disclosure may readily visualize the manner in which the ungrounded fingers at each of the remaining switch positions 3 through 16 are connected by printed wiring to an edge terminal 3 through 16 on the terminal area 15 of the printed circuit board 10.

The grounded fingers at each switch position in a given row are coupled together by first and second conductive links, such as links 38 and 40 which extend between the grounded fingers of switch position 1 and switch position 2. Similarly, conductive links 42 and 44 join the grounded finger set of switch position 2 to that of switch position 3. Finally, conductive links 46 and 48 join the grounded finger set of switch position 3 to that of switch position 4. Similar horizontally extending pairs of conductive links join the grounded finger set in rows 2, 3 and 4 together on a row-by-row basis.

The terminal labeled "G" at the edge 13 of the printed circuit board terminal area 15 is connected by a conductor 50 to junction points 52, 54 and 56. Terminal "G" refers to the common ground point for the printed circuit board 12. At junction 52, the ground conductor 50 is electrically joined to a vertically extending link 58 which, in turn, connects to the grounded set of fingers associated with switch positions 7 and 11. The junction point 54 establishes electrical continuity between the ground conductor 50 and the sets of grounded fingers associated with switch positions 6 and 10. This is accomplished by means of the vertical link 60. At junction point 56, the ground conductor 50 is joined to the sets of grounded fingers associated with all of the switch positions in column 1, namely, switch positions 1, 5, 9 and 13. This is accomplished by means of the vertically extending printed conductor link 62.

By tracing the conductors represented by the heavier lines in FIG. 1, it can be seen that the grounded set of fingers associated with each of the switch positions is electrically common to the terminal "G" at the edge 13 of the board terminal area 15. For example, one can trace a path from the grounded finger set at switch position 4 to the terminal point "G" by observing the links 46, 48 to switch position 3, the links 42 and 44 to switch position 2, the links 38 and 40 to switch position 1, the vertical link 62 to junction point 56 and the conductor 50 to the terminal "G".

Now that the details of the layout of the printed circuit pattern forming a preferred embodiment of the invention has been described, a description will be given to the manner in which this pattern permits segmentation along various axes to permit the board to be sheared to a desired size containing fewer switch positions than the maximum for which the array 10 is initially designed.

In FIG. 1, the lines along which the printed circuit board 12 may be sheared to provide for a smaller array of diaphragm-type switch positions are represented by horizontally and vertically extending broken lines. While the universal printed circuit pattern is shown in its entirety as including 16 switch positions, one desiring a panel with only 12 such positions has the option of providing same by shearing or otherwise severing the board along broken line A—A or B—B. If any one of these options is chosen, there will still be electrical continuity between the ground terminal "G" at the edge of the printed circuit board terminal area and the conductors at the terminal area associated with the ungrounded fingers of each of the switch positions which would still remain following the severing operation. For example, if the board 12 were sheared along the line A—A, the remaining panel would consist of switch positions 5 through 16. This cutting operation does not break any of the conductors associated with the ungrounded fingers of any of these 12 switch positions, nor does it break the connection between the terminal "G" and the sets of grounded fingers associated with these remaining switch positions. Likewise, severing the board along the broken line B—B would result in a 12 position panel including switch positions 1 through 12 and neither the conductors associated with the ungrounded fingers in each of the remaining switch positions nor the ground conductor associated with the grounded fingers for these switch positions is severed. Severing along broken A—A, of course, does sever the conductors such as 34 and 36 associated with switch positions 1 and 2 as well as the conductive leads used to bring out the ungrounded fingers of switch positions 3 and 4 to terminals 3 and 4 at the edge 13 of the board terminal area 15. Similarly, by shearing the printed circuit board along the line B—B would destroy the continuity between terminal points 13, 14, 15 and 16 at the edge 13 and their associated ungrounded fingers.

If it is desired to provide a switch panel having only 8 switch positions, it can readily be observed that one may shear the universal board 10 along both broken lines A—A and B—B. This would leave switch positions 5 through 12 intact. Again, shearing along these two lines only severs those leads to the edge 13 which are associated with switch positions 1 through 4 and 13 through 16 as well as the grounding link 62. As such, the only active terminal points at the edge 13, following the severing step, would be those leading to the ungrounded fingers for switch positions 5 through 12 and the terminal "G".

One desiring a 6 switch position array can achieve same by selectively severing the universal board 10 along the broken lines A—A, B—B and C—C. This would result in a panel having switch positions 6, 7, 8 and 10, 11, 12 as the active members. The links 58 and 60 which connect to the common ground conductor 50 at junctions 52 and 54 as well as the horizontally extending links which join the grounded fingers of switch positions 6 to 7 and 7 to 8 and 10 to 11 and 11 to 12 remain intact. Likewise, the severing along broken lines A—A, B—B and C—C does not sever any of the printed wiring that is used to bring out the electrical connection to the ungrounded fingers of switch positions 6, 7, 8, 10, 11 and 12 to their associated terminal points at the edge 13 of the board 12.

Finally, one desiring a 4 position switch array can achieve same by severing the universal board 10 along the broken lines A—A, B—B and D—D. This action would result in a panel wherein switch positions 7, 8, 11 and 12 remain operative. Specifically, the ground terminal "G" would be linked to switch positions 7, 8, 11 and 12 by way of conductor 50 and vertical link 58 which joins to conductor 50 at the junction point 52. Only those conductors associated with the ungrounded fingers at switch position 7, 8, 11 and 12 will remain intact. It can be readily seen that severing along the broken line D—D will cut the conductors joining the ungrounded fingers of all of the switch positions in columns 1 and 2 and will also destroy the horizontal ground links joining the grounded fingers of switch positions 2-3, 6-7, 10-11 and 14-15. Severing along the lines A—A and B—B also effectively removes the switch positions in rows 1 and 4 in the manner already described.

Thus, in connection with FIG. 1, there has been shown one embodiment of a universal printed circuit board for use with diaphragm-type push button switches which will accommodate a first predetermined number of switch positions and a way of selectively shearing this universal board so as to provide a printed circuit panel which will accommodate a panel having a desired and lesser number of switch positions. As such, the present invention obviates the need for preparing and producing unique art work for fabricating switch panels of differing sizes. One is able to fabricate only a single panel and then, through a cutting process, form usable printed circuit board underlays for diaphragm-type switches of lesser numbers.

DESCRIPTION OF ALTERNATE EMBODIMENT

Figure 2:
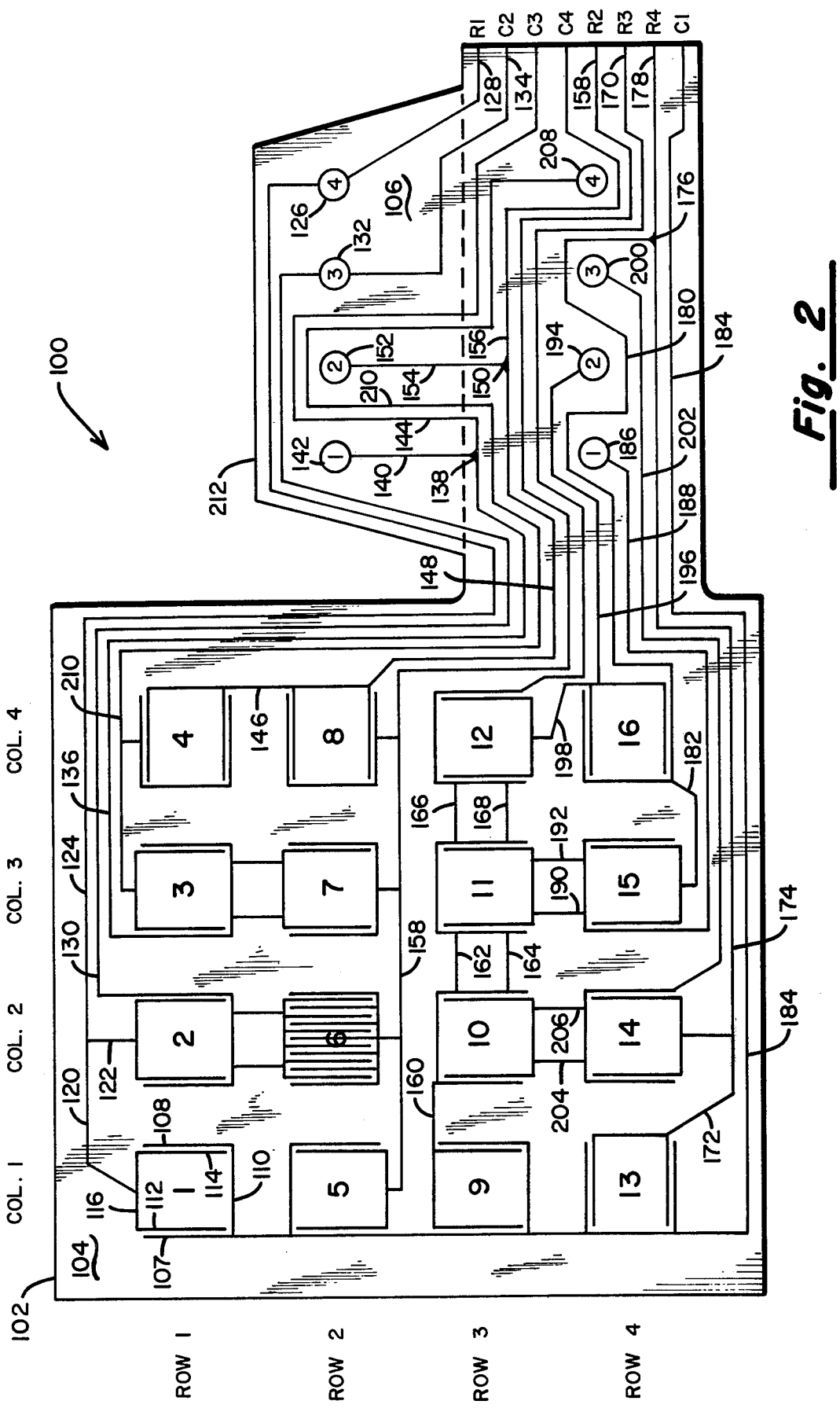
FIG. 2 is a plan view of a second embodiment of the invention.

Referring next to FIG. 2, there is shown an alternative printed circuit pattern arrangement suitable for use with diaphragm-type switch panels which is designed to accommodate a first plurality of such switches but which may be readily adapted to accommodate a lesser number of switches through the selective shearing or cutting of the universal arrangement. As is shown in FIG. 2, there is provided a printed circuit indicated generally by numeral 100 which comprises a flexible insulating substrate 102 which may preferably be formed from Mylar material of the type commonly used in the manufacture of flexible printed circuitry. The substrate 102 is configured so as to have a first rectangular area 104 and an irregularly shaped terminal area 106.

As in the embodiment of FIG. 1, a plurality of switch positions are oriented in a matrix array of rows and columns. Again, while 16 such switch positions are illustrated, limitation thereto is not intended since additional rows and columns may be added to provide a switch panel of a larger size. Each of the switch positions is identified by a large numeral 1 through 16, but in practice, these numerals would not appear on the printed circuit board but are only shown for ease in reference to a given switch position in the following detailed description.

At each switch position in the coordinate array there is disposed first and second sets of conductors which are interleaved one with the other, all of the fingers in a given set being electrically connected together. This configuration is illustrated in detail at switch position 6 at the intersection of row 2 and column 2. To simplify the drawings, however, each of the remaining switch positions only illustrates the first and second sets as having two fingers which are interleaved with the fingers of the associated set. With reference to switch position 1, it may be noted that a first set of fingers includes the fingers 106 and 108 which are electrically connected by a bridging conductor 110. The second set of fingers associated with switch position 1 includes the fingers 112 and 114 which are electrically connected by a bridging conductor 116. Because the set of fingers including fingers 112 and 114 appear to be contained within the set including fingers 106 and 108, the set of fingers connected together by the conductor 116 will be referred to as the "inner" set of fingers whereas those connected together by the bridging conductor 110 will be referred to as the "outer" set of fingers. The flexible printed circuit coverlay 102 is adapted to be affixed to a substantially rigid substrate by a suitable bonding means and in forming a diaphragm-type switch panel, a spacer layer having apertures aligned with each of the discrete switch positions on the substrate 102 is juxtaposed over the pattern illustrated in FIG. 2. Then, on the opposite side of the spacer layer (not shown) there is positioned a flexible printed circuit layer having a conductive pattern on the inner surface thereof which registers with the apertures in the spacer layer. Thus, by depressing the top flexible layer (not shown) the conductive pattern thereon is forced through the aperture to bridge adjacent fingers of the inner and outer set at the selected switch position. This action electrically connects the fingers of the inner and outer set and results in an electrical circuit being established between selected terminals labeled "R1 through R4 and C1 through C4" at the extreme right-hand edge 118 of the flexible printed circuit 100. The manner in which this is accomplished will be set forth in greater detail hereinbelow.

The inner set of fingers at switch positions 1 and 2 are joined together by printed circuit conductors 120 and 122 and the junction therebetween is connected by a printed circuit conductor 124 to a conductive pad area 126 located on the irregularly shaped terminal area 106 of the coverlay 100. A printed conductor 128 also joins this pad area 126 to the edge terminal R1. A conductor 130 fabricated by conventional printed circuit technology on the substrate 102 connects the outer set of fingers of switch position 2 to a conductive pad area 132 on the terminal portion 106 of the substrate and a printed conductor 134 connects the pad area 132 to the edge terminal C2.

A printed conductor 136 connects the inner set of conductive fingers of switch position 7 and the outer set of fingers of switch position 3 to a junction point 138 to which is connected by a link 140 a conductive pad area 142. The junction point 138 is also connected by a printed conductor 144 to the edge terminal C3.

The inner set of fingers at switch positions 4 and 8 are coupled together by a conductive link 146 and a conductor 148 also connects to the set of inner fingers at switch positions 4 and 8, joining them to a junction point 150 to which a conductive pad area 152 is connected by a printed wiring link 154. A printed conductor 156 connects the junction 150 to the edge terminal C4.

The inner set of fingers at switch position 5 are connected to the outer set of fingers at switch position 6, 7 and 8 by a conductor 158 which is routed across the irregularly shaped terminal area 106 of the printed circuit to the edge terminal R2.

The inner set of conductive fingers at switch position 9 is joined to the outer set of fingers at switch position 10 by means of a conductor 160. The outer set of fingers at switch position 10 are joined by the conductive links 162 and 164 to the set of outer fingers at switch position 11. Similarly, conductive links 166 and 168 join the outer set of fingers at switch position 11 to those at switch position 12. A printed conductor 170 is routed from the set of outer fingers at switch position 12 to the edge terminal R3.

The inner set of conductive fingers associated with switch positions 13 and 14 are joined together by a printed conductor 172 and a printed conductor 174 joins them to a junction point 176 on the flexible printed circuit terminal area 106. A conductor 178 joins the junction 176 to the edge terminal R4. A conductor 180 also formed on the terminal area of the substrate joins the junction 176 to the set of outer fingers associated with switch position 16 and a conductive link 182 establishes an electrical connection between the outer fingers at switch position 16 to the inner conductive fingers associated with switch position 15.

Finally, a conductor 184 runs from the edge terminal C1 across the terminal area 106 of the flexible printed circuit substrate 102 and across the rectangular shaped substrate to join the outer set of fingers of switch positions 1, 5, 9 and 13.

A conductive pad area 186 is connected by a printed conductor 188 to the outer set of fingers associated with switch position 15 and this last mentioned set of fingers is electrically coupled to the inner set of fingers at switch position 11 by means of the conductive links 190 and 192. In a similar fashion, a conductive pad area 194 is joined by a printed conductor 196 to the set of inner conductive fingers associated with switch position 16 and a conductive link 198 couples the inner fingers of switch position 16 to those of switch position 12. A conductive pad area 200 on the terminal portion 106 of the flexible printed circuit 100 is connected by a printed conductor 202 to the set of outer conductive fingers associated with switch position 14 while links 204 and 206 join the set of outer fingers of switch position 14 to the set of inner conductive fingers associated with switch position 10. Lastly, a conductive pad area 208 on the terminal area 106 of the flexible printed circuit coverlay 100 is connected by a printed conductor 210 to the set of outer fingers associated with switch position 4 and to the set of inner conductive fingers associated with the switch position number 3.

It is to be noted that the flexible substrate terminal portion 106 has a trapezoidally shaped segment 212. This segment of the substrate is adapted to be folded along a line which would define the base of the trapezoid 212 and when this is accomplished, it will be seen that the conductive pad areas 142, 152, 132 and 126 will be juxtaposed with the conductive pad areas 186, 194, 200 and 208. Suitable conductive pins or eyelets may be inserted in the now overlapped pad areas to ensure good electrical continuity therebetween.

Now that the details of the layout of the alternative embodiment of the present invention has been set forth in detail, consideration will be given as to the manner in which the diaphragm-type switch will operate as well as to the manner in which the substrate 102 may be sheared to accommodate a diaphragm-type switch panel having fewer switch positions than the maximum number selected for the original universal pattern.

For purposes of illustration, let it be assumed that the printed circuit arrangement of FIG. 2 is disposed in a working relationship with the apertured spacer and flexible cover sheet of a diaphragm-type switch. Further assume that the operator depresses the flexible sheet in the area associated with switch position 11. The pressure of the operator's finger would distort the flexible cover through the apertured spacer so that the conductive pattern on the underside of the flexible cover member will establish a short circuit between the interleaves inner and outer finger sets at switch position 11. By tracing through the pattern, it will be noted that terminal C3 and terminal R3 at the edge 118 will be shorted together. This means that the diaphragm-type switch at the inner section of Row 3 and Column 3, i.e., switch position 11, has been activated. In tracing this path, it will be noted that conductive links 166 and 168 join the outer conductive fingers of switch position 11 to those of switch position 12 and that the conductor 170 joins the outer conductive fingers of switch position 12 to the terminal point R3. The inner set of conductive fingers of switch position 11 are joined by conductive links 190 and 192 to the outer set of fingers associated with switch position 15. A conductor 188 joins the outer fingers of switch position 15 to the pad area 186 which is now in electrical contact with the pad area 142. The conductive link 140 thus is common to the pad area 186. Conductor 144 then joins the conductor 140 at junction 138 and completes the path to the terminal labeled C3. Assuming that switch position 11 is depressed, only terminals C3 and R3 will have a substantially zero resistance across them. Any other combination of terminals will have a substantial (open-circuit) resistance.

By a similar circuit tracing technique, one skilled in the art may discern from the arrangement in FIG. 2 that the depression of any one of the plurality of switch positions will result in a zero resistance indication at the output terminals R1 through R4 and C1 through C4 corresponding to the particular row and column at which the inner and outer set of fingers were bridged by virtue of the depression of a key by the operator.

One may also observe that it is possible to shear or otherwise sever the rectangular array along any one or more of a plurality of lines without destroying the circuit integrity as far as the remaining switch positions are concerned. For example, if one were to shear off the leftmost column, i.e., switch positions 1, 5, 9 and 13 by cutting through the substrate 102 in the vacant areas between columns 1 and 2 that only switch positions 1, 5, 9 and 13 will be disconnected. The remaining switches in columns 2, 3 and 4 will continue to function in the manner previously described since no break will occur in the series path between the row and column terminals at the edge 118 which are associated with the still remaining columns.

In fact, one may choose to sever the substrate along a line passing midway between columns 2 and 3 or between columns 3 and 4 to thereby accommodate a switch panel having 8 or 4 switch positions, respectively. One may also shear the substrate along a line midway between rows 1 and 2 or 2 and 3 to accommodate a switch panel having 12 to 8 switch positions, respectively. The only limitation on the flexibility of selecting fewer switch positions is that it is not possible to sever the substrate along a line midway between rows 3 and 4 because to do this would destroy the routing pattern established between the conductive pad areas on the terminal portion 106.

Accordingly, it can be seen that the same universal overlay as depicted in FIG. 2 can be prepared and subsequently selectively severed to provide as few as 2 active switch positions, i.e., switch positions 12 and 16.

While specific embodiments of the invention have been shown and described in detail, to illustrate the application of the principals of the invention, it will be understood that the invention may be embodied otherwise, without departing from such principals; therefore, the full scope of the invention is to be interpreted from the appended claims.

What is claimed is:

1. A printed circuit board for use in diaphragm-type electrical switch panels comprising:
   (a) an insulating substrate having formed thereon at predetermined coordinate locations of rows and columns on a first area a pattern of first and second sets of conductive fingers, the fingers in each set being conductively connected one with the other in that set and interleaved in a noncontact relationship with the fingers on the other set, said substrate having a second area terminating at a single edge along which plural terminal positions are established; and
   (b) conductor means formed on said insulating substrate connecting said first and said second sets of conductive fingers at each of said predetermined coordinate locations to said plural terminal positions, the conductor means being routed on said first area such that severing of said substrate along plural axes between said rows and columns in said first area does not destroy the continuity of said conductor means connecting the remaining ones of said first and second sets of conductive fingers to said plural terminal positions following such severing.

2. The printed circuit board as in claim 1 wherein said conductor means connecting said first and second sets of conductive fingers at each of said coordinate locations to said plural terminal positions includes:
   (a) a plurality of printed circuit conductive links on said first area connecting all of said first sets of conductive fingers at said predetermined coordinate locations to a single one of said plural terminal positions at said single edge; and
   (b) a plurality of printed circuit lines connecting each of said second sets of conductive fingers at said predetermined coordinate locations to individual ones of said plural terminal positions at said single edge.

3. The printed circuit board as in claim 1 wherein said conductor means connecting said first and second sets of conductive fingers at each of said coordinate locations to said plural terminal positions includes:
   (a) a first printed circuit conductor connecting said first set of conductive fingers at a given coordinate location to one of said plural terminal locations at said single edge corresponding to the row designation of said given coordinate location; and
   (b) a second printed circuit conductor connecting said second set of conductive fingers at said given coordinate location to one of said plural terminal locations at said single edge corresponding to the column designation of said given coordinate location.

4. The printed circuit board as in claim 1 wherein:
   (a) said insulating substrate is a flexible material;
   (b) said second area includes a plurality of conductive pads arranged in aligned pairs along the length dimension thereof and substantially equally spaced above and below one border defining the length of said edge such that when said second area is folded along said border, the aligned pairs of conductive pads are juxtaposed, one above the other; and
   (c) said conductor means electrically connects at least one of said pads in each aligned pair individually to a terminal position along said single edge.

5. A method for manufacturing printed circuit boards for use in diaphragm-type push button electrical switch panels comprising the steps of:
   (a) forming first and second conductive contact areas at a plurality of coordinate locations aligned in rows and columns on the surface of an insulating substrate;
   (b) forming a plurality of conductive terminal points at one edge of said substrate;
   (c) forming a plurality of conductors on said substrate, at least one conductor being connected to said first conductive contact area at each of said plurality of coordinate locations, the remaining conductors individually linking the second conductive contact area at each of said plurality of coordinate locations to one of said conductive terminal areas; and
   (d) cutting said substrate along one or more axes between said rows or columns without shearing said plurality of conductors associated with those first and second contact areas at the coordinate locations remaining after said cutting step.

* * * * *